United States Patent [19]

Kitahara et al.

[11] Patent Number: 4,948,748
[45] Date of Patent: Aug. 14, 1990

[54] MANUFACTURE OF A SUBSTRATE STRUCTURE FOR A COMPOSITE SEMICONDUCTOR DEVICE USING WAFER BONDING AND EPITAXIAL REFILL

[75] Inventors: Koichi Kitahara, Kawasaki; Yu Ohata, Tokyo; Tsuyoshi Kuramoto, Yokohama, all of Japan

[73] Assignee: Kabushiki Kaisha Toshiba, Kawasaki, Japan

[21] Appl. No.: 396,792

[22] Filed: Aug. 21, 1989

Related U.S. Application Data

[63] Continuation of Ser. No. 215,381, Jul. 5, 1988, abandoned, which is a continuation of Ser. No. 911,895, Sep. 26, 1986, abandoned.

[30] Foreign Application Priority Data

Sep. 30, 1985 [JP] Japan .................................. 60-214853

[51] Int. Cl.⁵ ..................... H01L 21/20; H01L 21/306
[52] U.S. Cl. .......................................... 437/62; 437/78; 437/90; 148/DIG. 12; 148/DIG. 135
[58] Field of Search ............................. 437/90, 78, 62; 148/DIG. 12, DIG. 135

[56] References Cited

U.S. PATENT DOCUMENTS

| | | | |
|---|---|---|---|
| 4,139,401 | 2/1979 | McWilliams | 357/49 |
| 4,184,172 | 1/1980 | Raffel et al. | 357/49 |
| 4,473,598 | 9/1984 | Ephrath et al. | 437/78 |
| 4,501,060 | 2/1985 | Frye et al. | |
| 4,507,158 | 3/1985 | Kamins et al. | |
| 4,593,458 | 6/1986 | Adler | 357/49 |
| 4,601,779 | 7/1986 | Abernathey et al. | 356/633 |
| 4,829,018 | 5/1989 | Wahlstrom | 148/DIG. 135 |

FOREIGN PATENT DOCUMENTS

| | | |
|---|---|---|
| 0141506 | 5/1985 | European Pat. Off. |
| 0147626 | 7/1985 | European Pat. Off. ............ 357/49 |
| 0176747 | 8/1985 | European Pat. Off. ............ 437/62 |
| 0155698 | 9/1985 | European Pat. Off. |
| 57-89247 | 6/1982 | Japan ................................. 357/49 |
| 64-012543 | 1/1989 | Japan ....................... 148/DIG. 135 |

OTHER PUBLICATIONS

Yu Ohata et al., "Dielectrically Isolated Intelligent Power Switch", IEEE 1987 Custom Integrated Circuits Conference, pp. 443-446.
Brock et al., "Fusion of Silicon Wafers" IBM Tech. Disc. Bull., vol. 19, No. 9, Feb. 1977, pp. 3405-3406.
Sugawara et al., "Practical Size Limits of High Voltage IC's," IEDM Technical Digest, pp. 412-415, Dec. 1983.
Lasky et al., "Silicon-on-Insulator (SOI) by Bonding and Etch-Back," IEDM Technical Digest, pp. 684-687, Dec. 1985.

*Primary Examiner*—Brian E. Hearn
*Assistant Examiner*—Laura Holtzman
*Attorney, Agent, or Firm*—Finnegan, Henderson, Farabow, Garrett and Dunner

[57] ABSTRACT

A substrate structure for a composite semiconductor device comprises first and second semiconductor substrates whose major surfaces are bonded to each other with an insulating layer interposed therebetween. In this substrate structure, an epitaxial layer is grown from part of the second semiconductor substrate, forming one element area, and another element area is formed in the first semiconductor substrate area and isolated from the epitaxial layer.

7 Claims, 5 Drawing Sheets

MANUFACTURE OF A SUBSTRATE STRUCTURE FOR A COMPOSITE SEMICONDUCTOR DEVICE USING WAFER BONDING AND EPITAXIAL REFILL

This application is a continuation, of application Ser. No. 215,381, filed July 5, 1988, now abandoned, which is a continuation of application Ser. No. 911,895, filed Sept. 26, 1986, now abandoned.

BACKGROUND OF THE INVENTION

1. Field of the Invention

This invention relates to a substrate structure for a composite semiconductor device suitable for the formation of a plurality of functional elements which require element isolation.

2. Description of the Prior Art

In a composite semiconductor device having a plurality of active elements or passive elements integrated on a single substrate it is necessary to electrically isolate such elements from other elements. An isolation method for this purpose includes, for example, a method utilizing a reverse-biased PN junction, or a method utilizing an insulating material.

A semiconductor substrate having areas separated by a PN junction will be explained below by way of example.

An N type epitaxial layer is deposited on a P type semiconductor substrate, and P+ type impurity is diffused into an epitaxial layer to form an element isolation area reaching the semiconductor substrate. In this way an island-like element area is obtained which is surrounded by that PN junction. The element area is electrically isolated from other epitaxial layer portions by a depletion layer when a reverse bias is applied to the PN junction. This system offers an advantage of being lower in cost. When, on the other hand, a P+ type element isolation area is formed, diffusion unavoidably occurs in a lateral direction to an extent substantially equal to that to which it occurs in a depth direction, causing an increase in element isolation area. In the PN junction isolation a reverse bias is used in which case, since the P+ type element isolation area is usually grounded, an N type layer in the element area adjacent to the isolation layer needs to be held normally at a positive potential. Thus a bias circuit in an integral circuit which is formed within the element area is restricted. Where, for example, transistors of different conductivity types are to be formed, it will be necessary to provide a very complex bias circuit. Furthermore, in the PN junction isolation a parasitic element is usually liable to be formed. Where a transistor is formed, for example, with emitter and base layers formed in the element area and with a semiconductor substrate as a collector, a parasitic transistor can be formed due to the presence of the emitter layer, base layer and P+ type element isolation area.

The element isolation method using an insulating layer will be explained below with respect to FIG. 1.

In a plurality of N type semiconductor element areas, island-like areas are formed which are separated by oxide silicon film 2 and polysilicon layer 3. This method obviates the necessity of providing a reverse bias circuit which is required in the PN junction separation. Furthermore, a restriction caused by the parasitic element can be alleviated. However, since in this system the substrate is formed of a polysilicon, a thicker substrate is needed, which presents an economical disadvantage. It is also noted that, in a completed device, the reverse surface of the substrate cannot be employed as a current passage because the lower portion, including reverse surface of the substrate, is insulated.

SUMMARY OF THE INVENTION

It is accordingly the object of this invention to provide a semiconductor substrate structure which can eliminate various drawbacks encountered in the aforementioned element isolation method and can readily integrate functional elements in the formation of a composite semiconductor device.

According to this invention a substrate structure for a composite semiconductor device is provided which comprises:

a composite substrate comprised of first and second semiconductor substrates whose major surfaces are bonded to each other through an insulating film therebetween;

an etched area formed by selectively etching the first semiconductor substrate and insulating film to reach at least the second semiconductor substrate; and an epitaxial layer formed on the second semiconductor substrate in that etched area.

In the semiconductor substrate structure so formed, element isolation areas are selectively formed in the first semiconductor substrate with each element isolation area defined by the etched area and reaching the insulating film from the surface of the first semiconductor substrate, and other element areas can be formed which comprise the second semiconductor substrate and epitaxial layer, formed monolithic with the second semiconductor substrate. In this case, the element area of the first semiconductor substrate portion, second semiconductor substrate and epitaxial layer can be properly adjusted in their impurity concentration level and thickness.

Thus a bipolar element, N-MOS, P-MOS, condenser, resistor, etc. can be formed in the first semiconductor substrate portions defined by the etched areas, and a power element is formed in the epitaxial layer overlying the second semiconductor substrate. These functional elements are connected through, for example, an aluminum interconnection layer. In this way an integrated circuit can be formed which has a high withstand voltage and large current capacity.

DESCRIPTION OF THE PREFERRED EMBODIMENT

A substrate for a composite semiconductor device according to this invention will be described below with reference to the accompanying drawings.

Figure 1:
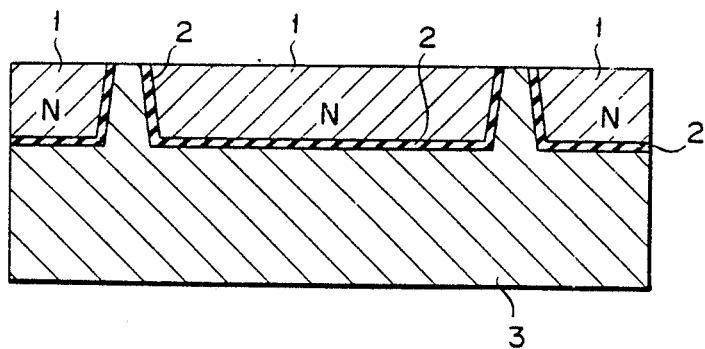
FIG. 1 is a cross-sectional view showing a semiconductor substrate formed by a conventional dielectric isolation method.
Figure 2A:
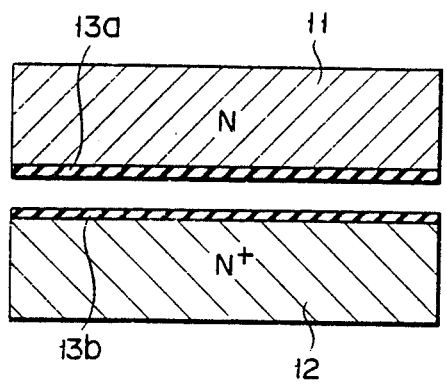
FIGS. 2A to 2I are cross-sectional views showing the steps of manufacturing a substrate structure for a composite semiconductor device according to one embodiment of this invention.
Figure 2B:
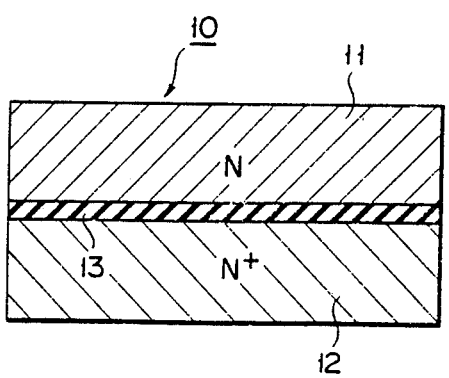
Figure 2C:
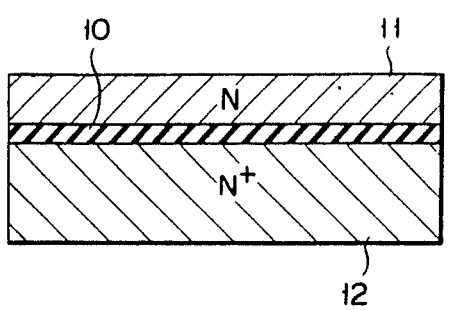
Figure 2D:
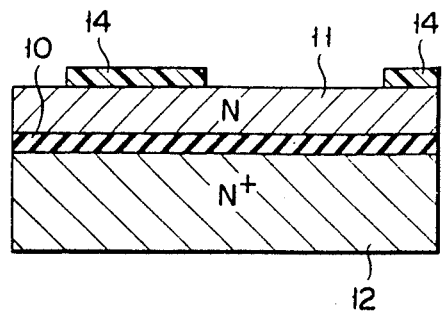

The bonding surface (about 500 μm-thick), first semiconductor substrate 11 (formed of an N type silicon about 500 μm-thick), and second semiconductor substrate 12 (formed of an N+ type silicon) are mirror-finished to provide a surface roughness of below 500 Å each. At this time a degreasing step is performed with a step for removing an impurity-containing film on the surface of a silicon wafer surface, such as an oxide film, depending upon the surface state of the silicon wafer. After being treated with clean water, about 1 μm-thick thermal oxidation films (insulating films) 13a, 13b are formed on the bonding surfaces of these substrates in a clean atmosphere of below Class 1 as shown in FIG. 2A.

Figure 2E:
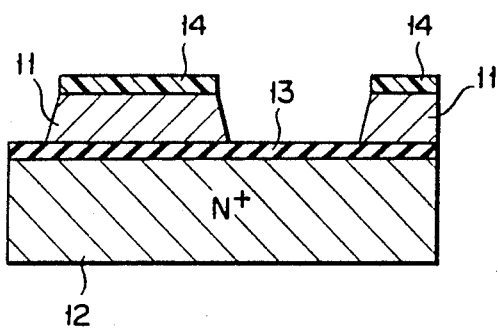
Figure 2F:
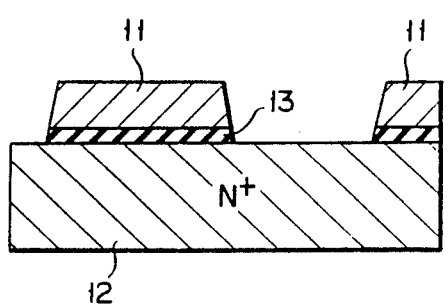
Figure 2G:
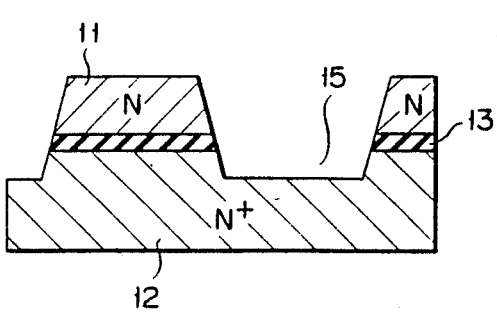
Figure 2H:
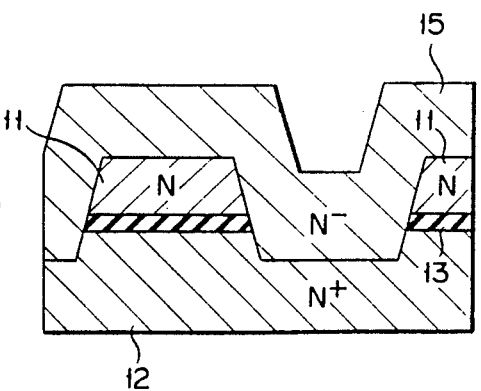
Figure 2I:
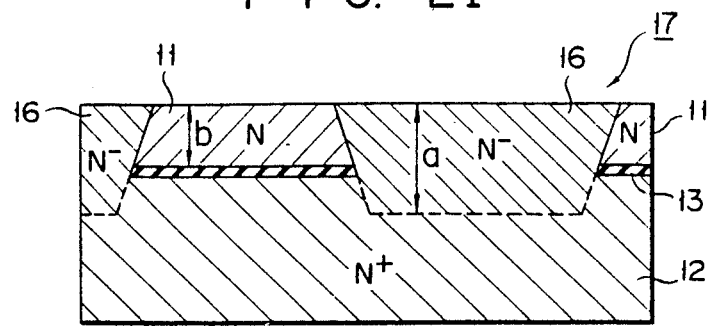
Figure 3:
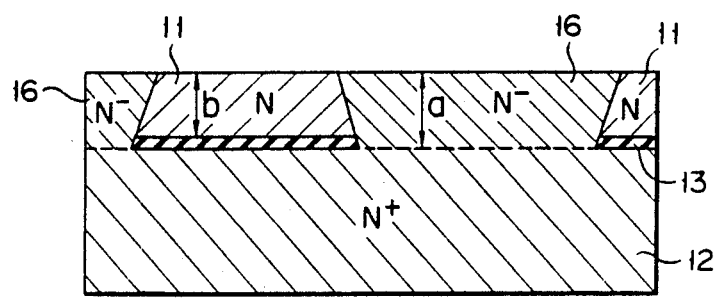
FIGS. 3 and 4 are cross-sectional views showing a substrate structure for a composite semiconductor device according to another embodiment of this invention.
Figure 4:
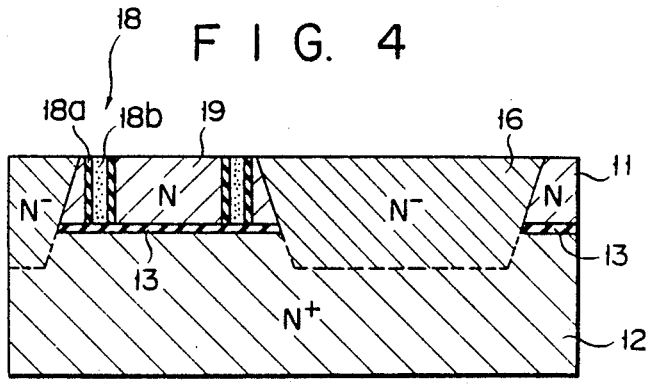

Then the resultant surfaces of first and second semiconductor substrates 11 and 12 are attached to each other in an adequately clean atmosphere and this structure is then heat-treated at, for example, above 1000° C. to obtain composite substrate structure 10, with the mirror-finished surfaces bonded with oxide film 13 therebetween. The surface of the first semiconductor substrate 11 in composite substrate structure 10 is polished to have a thickness of, for example, about 100 μm (See FIG. 2) and oxide film 14 is selectively formed as an etching-resistant film on the surface of the resultant structure (see 2D). Then first semiconductor substrate 11 is selectively etched (with oxide film 14 as a mask) to expose portions of oxide film 13, as shown in FIG. 2E. Oxide film 14, on the surface of first semiconductor substrate 11, and exposed portions of oxide film 13 are etched away as shown in FIG. 2F. Then second semiconductor substrate 12 is etched down to a predetermined depth to provide etched area 15 as shown in FIG. 2G. As shown in FIG. 2H, an N-type silicon is vapor-grown on the surface of the resultant structure as shown in FIG. 2H to bury the etched area. In this way, epitaxial layer 16 is formed monolithic with second semiconductor substrate 12. Then the surface of the first semiconductor substrate portion is polished to leave a thickness of, for example, 20 μm, as shown in FIG. 2I.

In this way, substrate structure 17 for a composite semiconductor device according to this invention is completed.

Although in this embodiment the thickness "a" of epitaxial layer 16 is shown as being greater than the thickness "b" of the first semiconductor substrate portion, if a power element with, for example, a low withstand voltage and large current capacity is to be implemented, the thickness "a" of epitaxial layer 16 is made substantially equal to the thickness "b" of the first semiconductor substrate portion.

To such a substrate structure for a composite semiconductor device, a known device isolation technique is applicable to obtain a proper number of functional elements.

Element isolation area 18 is formed at the first semiconductor substrate portion except for eched area 15 or epitaxial layer 16, noting that the element isolation area reaches oxide film 13. In this embodiment a continuous groove of 4 to 5 μm in width is formed by an RIE (Reactive Ion Etching) method in the 20 μm-thick first semiconductor substrate portion and thermal oxidation film 18a is formed at that continuous groove. Then polysilicon layer 18b is deposited in the groove to obtain a planarized surface. The element isolation area 18 consists of thermal oxidation film 18a and polysilicon layer 18b and an island-like area, i.e. element area 19, is formed which is defined by element isolation area 18 and oxide film 13 so that element area 19 may be electrically isolated from the other areas. A plurality of such element areas 19 may be formed as desired. Although in this embodiment the element isolation area has been explained as being formed by a dielectric isolation method including the RIE step so as to reduce an area necessary for the formation of the element isolation area, a PN junction separation method using a P+ type region or another isolation method may be adopted as desired, noting that the latter method includes the steps of forming a V-shaped groove by a liquid phase etching and filling the groove with an insulating material.

Figure 5:
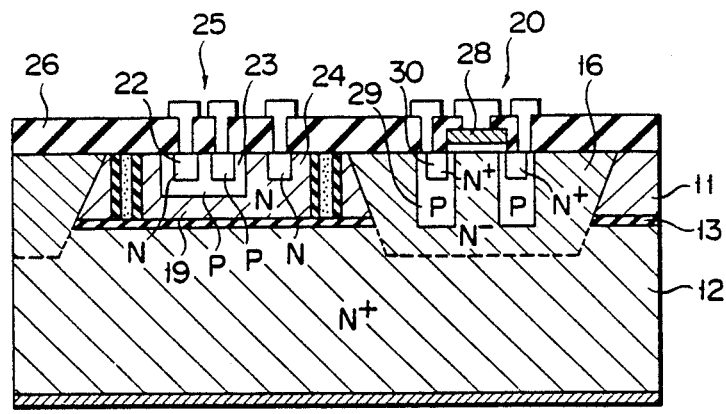
FIG. 5 is a cross-sectional view showing a practical application on a substrate structure for a composite semiconductor device.

FIG. 5 shows a practical application to a composite semiconductor device having functional elements formed at the substrate structure according to this invention.

That is, D-MOS FET 20 is formed as a power element in an element area comprised of second semiconductor substrate 12 and epitaxial layer 16 monolithic with second semiconductor substrate 12, and a control section of the D-MOS FET, which requires no adequate withstand voltage, is formed by a known technique in island-like element area 19. In FIG. 5 a transistor is shown by way of example which includes emitter 22, base 23 and collector 24 as constituent elements in the control section. In the surface portion of composite semiconductor device 17, insulating layer 26 is formed where gate 28 for D-MOS FET 20 is buried. As shown in FIG. 5. Base region 29 and source region 30 are formed by a known diffusion method and ion implanting method with gate 28 as a common impurity diffusion mask, and a channel of this FET is formed at an area left relative to the lateral distance of the impurity diffusion. The other area of epitaxial layer 16 and second semiconductor substrate 12 act as a drain or drain current passage. That is, conductive layer 31 is formed on the rear surface of second semiconductor substrate 12 and thus serves as a drain electrode for D-MOS FET 20.

Figure 6:
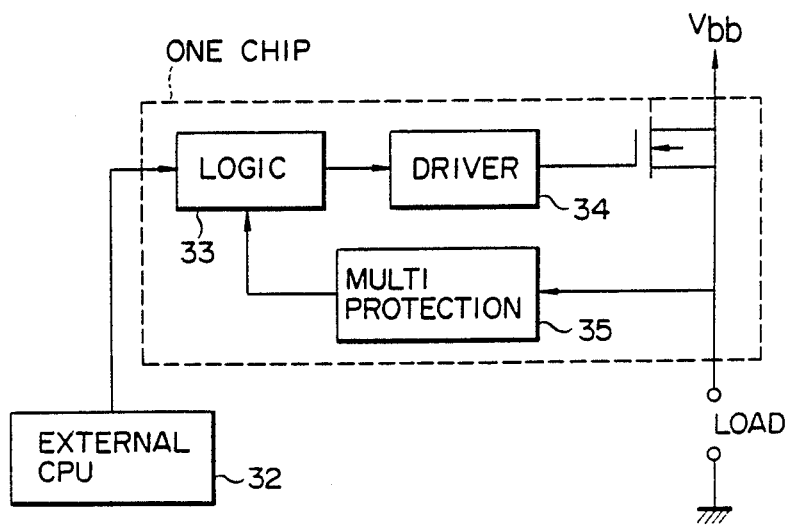
FIG. 6 is a block diagram showing a practical application on a substrate structure for a composite semiconductor device of this invention.

FIG. 6 shows one practical form of a driving circuit of the device of FIG. 5. In the arrangement shown in FIG. 6, functional elements such as logic 33, driver 34 and multi-protection 35 are formed in island-like element area 19, noting that data is supplied from external CUP 32. MOS-FET 20 is controlled through the driving circuit.

Figure 7:
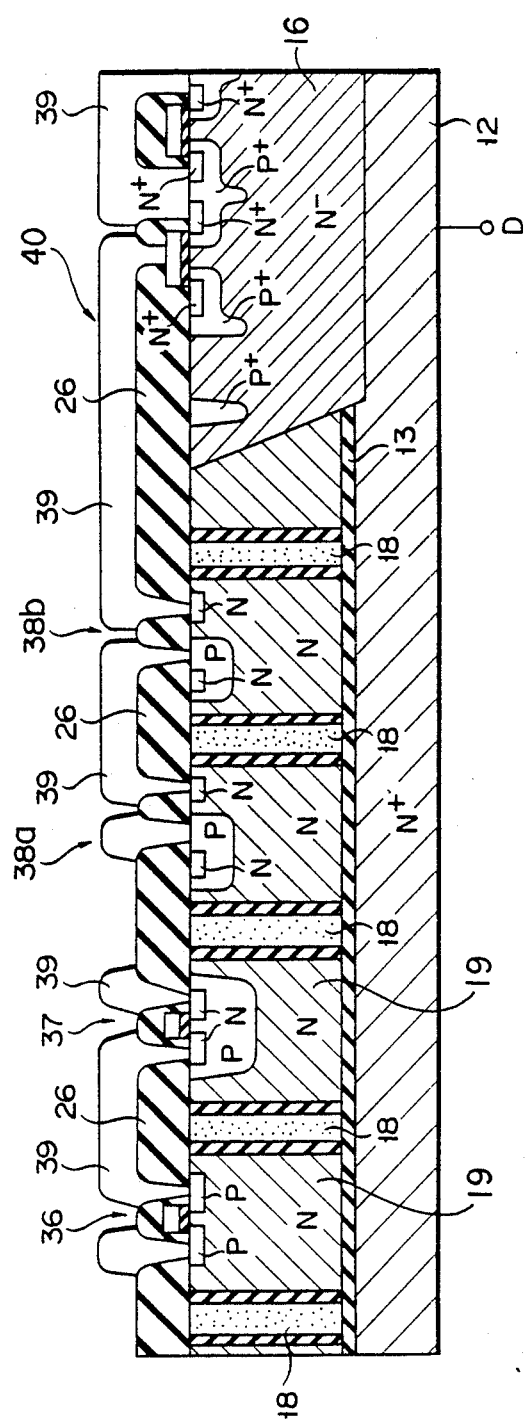
FIG. 7 is a cross-sectional view showing a substrate structure for a composite semiconductor device for an IC device.

FIG. 7 shows one practical application having a number of semiconductor elements separated by element isolation area 18 and oxide film 13. In the arrangement shown in FIG. 7, P-MOS 36, N-MOS 37 and bipolar transistors 38a, 38b are formed in the corresponding island-like element areas 19 and electrically connected to semiconductor elements 40 in epitaxial layer 16 through interconnection layer 39 overlying insulating layer 26, thus providing an integrated circuit having a high withstand voltage and large current capacity.

As set out above, desired semiconductor elements in the substrate structure of the composite semiconductor device can be completely isolated by the insulating material, and thus are less likely to be restricted from the standpoint of circuit design. Since the element areas of the first semiconductor substrate, second semiconductor substrate and epitaxial layer can be arbitrarily adjusted in their thickness and impurity concentration level, functional elements of different withstand voltage characteristics can be formed in proper combination for a composite semiconductor device. It is, therefore, advantageous to effectively utilize the rear surface portion of the composite semiconductor structure as a current passage.

What is claimed is:

1. A method of making a substrate structure for a composite semiconductor device comprising the steps of:
    (a) mirror-finishing a surface of each first and second semiconductor substrate;
    (b) forming by thermal oxidation an insulating film on the mirror-finished surfaces of the first and second semiconductor substrates;
    (c) bonding together the mirror finished surfaces of the first and second semiconductor substrates with the insulating film interposed between the bonded mirror-finished surfaces;
    (d) etching through a portion of the first semiconductor substrate and the insulating film to reach at least the second semiconductor substrate; and
    (e) forming an epitaxial layer on the second semiconductor substrate in the etched area.

2. The method of claim 1, further comprising the steps of:
    (a) forming an element isolation area in the first semiconductor substrate in an area distinct from the epitaxial layer of the composite substrate unit, the element isolation area reaching the insulating film on the first semiconductor substrate, and
    (b) forming an element area in the first semiconductor substrate area being electrically isolated from the epitaxial area.

3. The method of claim 2, wherein a plurality of element areas are formed in the first semiconductor substrate.

4. The method of claim 1, wherein the epitaxial layer has a thickness substantially equal to that of the first semiconductor substrate.

5. The method of claim 1, wherein the thickness of the epitaxial layer is substantially greater than that of the first semiconductor substrate.

6. The method of claim 2, wherein the epitaxial layer has an impurity concentration level different from that of the element isolation area of the first semiconductor substrate.

7. The method of claim 2, further comprising the steps of:
    (a) forming a power element in the epitaxial layer, and
    (b) forming semiconductor elements in the element isolation areas of the first semiconductor substrate to control the power element.

* * * * *